United States Patent [19]

Miyairi

[11] Patent Number: 5,018,155
[45] Date of Patent: May 21, 1991

[54] SEMICONDUCTOR LASER DRIVING APPARATUS TO BE USED FOR OPTICAL INFORMATION RECORDING AND REPRODUCING APPARATUS

[75] Inventor: Nobuo Miyairi, Fujino, Japan

[73] Assignee: Olympus Optical Co., Ltd., Tokyo, Japan

[21] Appl. No.: 585,463

[22] Filed: Sep. 20, 1990

[30] Foreign Application Priority Data

Sep. 22, 1989 [JP] Japan .................................. 1-247495

[51] Int. Cl.$^5$ ............................................. H01S 3/131
[52] U.S. Cl. ........................................ 372/31; 372/26; 372/29; 372/38
[58] Field of Search ....................... 372/29, 31, 32, 25, 372/26, 38

[56] References Cited

U.S. PATENT DOCUMENTS

| | | | |
|---|---|---|---|
| 4,611,352 | 9/1986 | Fujito et al. | 455/609 |
| 4,819,240 | 4/1989 | Takiguchi et al. | 372/26 |
| 4,819,242 | 4/1989 | Kaku et al. | 372/38 |
| 4,7999,069 | 1/1989 | Sasaki et al. | 346/108 |

FOREIGN PATENT DOCUMENTS

| | | |
|---|---|---|
| 59-9086 | 2/1984 | Japan . |
| 59-193554 | 11/1984 | Japan . |
| 60-111057 | 7/1985 | Japan . |

Primary Examiner—Frank Gonzalez
Assistant Examiner—Galen J. Hansen
Attorney, Agent, or Firm—Armstrong, Nikaido, Marmelstein, Kubovcik & Murray

[57] ABSTRACT

This semiconductor laser driving apparatus for driving a semiconductor laser and to be used for an optical information recording and reproducing apparatus doing at least one of recording and reproducing information in an information recording medium by using a light from the semiconductor laser comprises an emitted light amount detecting device for detecting the emitted light amount of the semiconductor laser, an output controlling device for controlling the output of the semiconductor laser on the basis of the detected output of the emitted light amount detecting device so as to be kept constant, a driving device for feeding said semiconductor laser with an operating direct current, a high frequency superimposing device for superimposing a high frequency current on the operating direct current from the driving means, a measuring device for measuring the variation of the emitted light amount of the semiconductor laser with the variation of the operating current of the semiconductor laser in the absence of the information recording medium in the focus position of the semiconductor laser and a superimposed amount controlling device for controlling the superimposed amount by the high frequency superimposing device in response to the measured result of the measuring means.

12 Claims, 5 Drawing Sheets

SEMICONDUCTOR LASER DRIVING APPARATUS TO BE USED FOR OPTICAL INFORMATION RECORDING AND REPRODUCING APPARATUS

BACKGROUND OF THE INVENTION

1. Field of the Invention

This invention relates to semiconductor laser driving apparatus to be used for optical information recording and reproducing apparatus and more particularly to a semiconductor laser driving apparatus for superimposing a high frequency.

2. Related Art Statement

Recently, with the development of the information industry, an optical information recording and reproducing apparatus has come to be noted as a large capacity memorizing apparatus.

In an optical information recording and reproducing apparatus using a semiconductor laser (mentioned as an LD hereinafter) as a light source, as a means for reducing the noises generated when the light emitted out of the LD returns to the LD itself and the LD mode competing noises during the operation of the apparatus, there is known an art of superimposing a high frequency on an LD as shown in the respective publications, for example, of Japanese Patent Application Publication No. 9086/1984, Japanese Utility Model Application Laid Open No. 111057/1985 and Japanese Patent Application Laid Open No. 193554/1984.

As described in said publications, in order to reduce noises, it is necessary to make the amplitude of a high frequency current large enough for the laser oscillation to be switched on and off by a high frequency, because, when the amplitude is large enough, the LD will hold a multiplex vertical mode oscillating state.

However, the LD varies greatly in the relation between the operating current and the emitted light amount depending on the fluctuation of the characteristics of the LD itself, the ambient temperature variation and the change with the lapse of time. Therefore, with these condition variations, the LD will be no longer able to keep the on-off state at a high frequency and the noises will not be reduced in some case.

The publication of said Japanese Patent Application Publication No. 9086/1984 discloses no means for determining the high frequency superimposing amount most adapted to the fluctuation of the inherent characteristics of the LD itself, the ambient temperature variation and the change with the lapse of time.

In the publication of said Japanese Utility Model Application Laid Open No. 111057/1985 is disclosed an art of varying the high frequency superimposing amount in response to the size of the driving direct current of the LD. However, at the time of superimposing a high frequency, the LD driving current will vary so greatly that the effect of superimposing a high frequency will depend not only on the size of the driving direct current but also on the characteristic of the variation of the emitted light amount with the LD driving current variation. As this characteristic varies with the fluctuation or the like of the LD characteristic, with the art shown in the publication of said Japanese Utility Model Application Laid Open No. 111057/1985, the high frequency superimposing amount will be in excess or short depending on the fluctuation or the like of the LD characteristic.

Also, in the publication of said Japanese Patent Application Laid Open No. 193554/1984 is disclosed an art wherein the high frequency superimposing effect is measured within a predetermined period during the reproduction of a signal and the high frequency superimposing amount is controlled in response to the measured result. However, the relation between the LD driving current and the emitted light amount is different between the case that there is a returning light to the LD and the case that there is no such light. In said art, as there is a returning light from the recording medium, there is a problem that the high frequency superimposing effect can not be accurately measured under the influence of the difference or the like of the reflection factor of the recording medium.

OBJECTS AND SUMMARY OF THE INVENTION

An object of the present invention is to provide a semiconductor laser driving apparatus to be used for an optical information recording and reproducing apparatus which can determine the most adapted high frequency superimposing and a method of controlling the amount of superimposing a high frequency current on the semiconductor laser.

Another object of the present invention is to provide a semiconductor laser driving apparatus to be used for an optical information recording and reproducing apparatus which can accurately determine the most adapted high frequency superimposing amount without being influenced by a returning light from the recording medium and a method of controlling the amount of superimposing a high frequency current on the semiconductor laser.

The semiconductor laser driving apparatus of the present invention comprises an emitted light amount detecting means for detecting the emitted light amount of the semiconductor laser, an output controlling means for controlling the output of the semiconductor laser to be kept constant on the basis of the output detected by said emitted light amount detecting means, a driving means for feeding the semiconductor laser with an operating direct current, a high frequency superimposing means for superimposing a high frequency current on the operating direct current from said driving means, a measuring means for measuring the variation of the emitted light amount of the semiconductor laser with the variation of the operating current of the semiconductor laser where the information recording medium is not in the focus position of the semiconductor laser and a superimposing amount controlling means for controlling the superimposing amount by said high frequency superimposing means in response to the measured result of said measuring means.

The method of controlling the superimposing amount of the high frequency current on the semiconductor laser of the present invention comprises a step of measuring the variation of the emitted light amount of the semiconductor laser with the variation of the operating current of the semiconductor laser where the information recording medium is not in the focus position of the semiconductor laser and a step of adjusting said superimposing amount in response to the measured result by said measuring step.

The other features and advantages of the present invention will become apparent enough with the following explanation.

BRIEF DESCRIPTION OF THE DRAWINGS

FIG. 1 is a block diagram showing the formation of a driving apparatus of a semiconductor laser.

FIG. 2 is a flow chart showing the operation of the driving apparatus of the semiconductor laser.

FIGS. 3(A) and (B) are characteristic diagrams showing the operating current-emitted light amount characteristics of a semiconductor laser in case the superimposing of a high frequency is switched on and off respectively where there is a returning light and where there is no such light.

FIG. 4 is a characteristic diagram showing the operating current-emitted light amount characteristics of the semiconductor laser when the step of the VCA of the high frequency oscillating unit is the smallest.

FIG. 5 is a characteristic diagram showing the operating current-emitted light amount characteristics of the semiconductor laser when the step of the VCA of the high frequency oscillating unit is small.

FIG. 6 is a characteristic diagram showing the operating current-emitted light amount characteristics of the semiconductor laser when the step of the VCA of the high frequency oscillating unit is large.

FIG. 7 is a block diagram showing a part of the driving apparatus of a semiconductor laser.

FIG. 8 is a flow chart showing a part of the operation of the driving apparatus of a semiconductor laser.

DETAILED DESCRIPTION OF THE PREFERRED EMBODIMENTS

In the present invention, in the case of initializing, for example, an optical information recording and reproducing apparatus by noting the quantum differential efficiency (mentioned as $\eta$ hereinafter) of a semiconductor laser, that is, the relation of the variation of the emitted light amount of the semiconductor laser with the operating current variation of the semiconductor laser, $\eta$ is measured by the measuring means and the superimposing amount by the high frequency superimposing means is increased or decreased in response to the measured value. In a semiconductor laser making such control (APC) as makes the emitted power of the semiconductor laser constant, if a high frequency wave is superimposed, in case the high frequency has been well superimposed, that is, when the semiconductor laser is switched on and off by the high frequency, the operating current of the semiconductor laser will decrease to cancel the emitted power elevated by superimposing the high frequency. If this decrease is represented by $\Delta I$ op, the relation of $$\Delta P = \eta \cdot \Delta I \text{ op,}$$

will hold. This $\Delta P$ is equal to the average power decreased so that the semiconductor laser may be off by superimposing a high frequency. Therefore, in order to keep the high frequency superimposing amount constant $\Delta P$ is made constant. That is to say, $\eta \cdot \Delta I$ op may be controlled to be constant.

Thus, when $\eta$ is measured, the high frequency superimposing amount is increased or decreased so as to be of a predetermined $\Delta P$ value and $\Delta I$ op is adjusted, the high frequency superimposing effect will be able to be kept constant.

FIGS. 1 to 6 show the first embodiment of the present invention.

Figure 1:
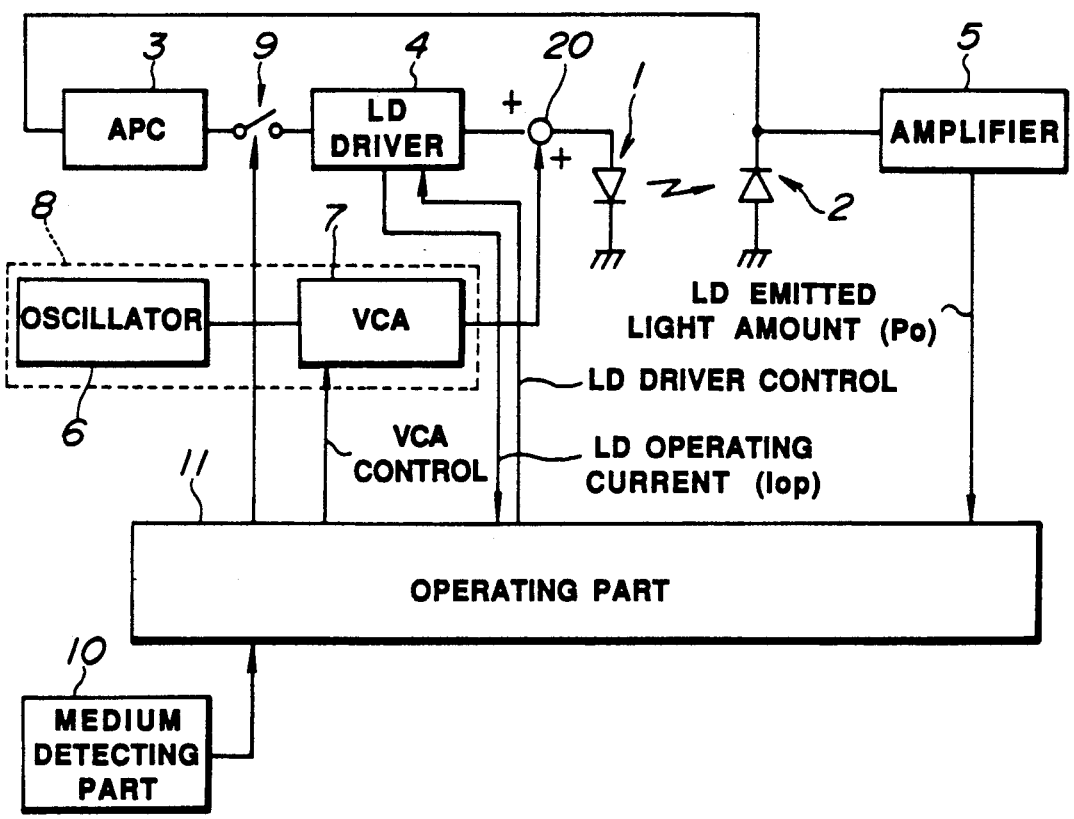
FIGS. 1 to 6 relate to the first embodiment of the present invention.

As shown in FIG. 1, a driving apparatus of a semiconductor laser to be used for an optical information recording and reproducing apparatus is provided within a light pickup with a semiconductor laser (mentioned as an LD hereinafter) as a light source so that a light emitted from this LD may be radiated to an information recording medium not illustrated through an optical system within the light pickup. The information is recorded, reproduced and erased by this light. The light emitted from said LD 1 is received by a photodetector (mentioned as a PD hereinafter) 2 and the emitted light amount of the LD 1 is detected by the output of this PD 2. Said PD 2 is connected to an APC (automatic photooutput control) circuit 3 and amplifier 5. The output of said amplifier 5 is to be input into an operating part 11. Said APC circuit 3 is connected to an LD driver 4 through an APC loop switch 9. An operating direct current output from this LD driver 4 is to be input into said LD1 through an adder 20. When an APC loop switch 9 is on, the emitted light amount of the LD1 will be controlled to be constant by an APC loop consisting of said PD 2, APC circuit 3, APC loop switch 9, LD driver 4, adder 30 and LD 1. Said APC loop switch 9 is to switched on and off by a signal from the operating part 11. Said LD driver 4 is to have the output operating current controlled by an LD driver control signal from said operating part. Further, the information of an LD operating current I op is to be input into said operating part 11 from this LD driver 4.

Also, in this embodiment, a high frequency oscillating unit 8 is provided as a high frequency superimposing means and superimposing amount controlling means. This high frequency oscillating unit 8 is provided with an oscillator 6 generating a high frequency and a VCA which is an amplifier whereby the amplitude (gain) is varied by the instruction from outside so that the high frequency output of said oscillator 6 may be output as amplified by said VCA. The output current of said VCA 7 is to be superimposed on the operating direct current from the LD driver 4. The gain cf said VCA 7 is controlled by the VCA control signal from the operating part 11.

Figure 2:
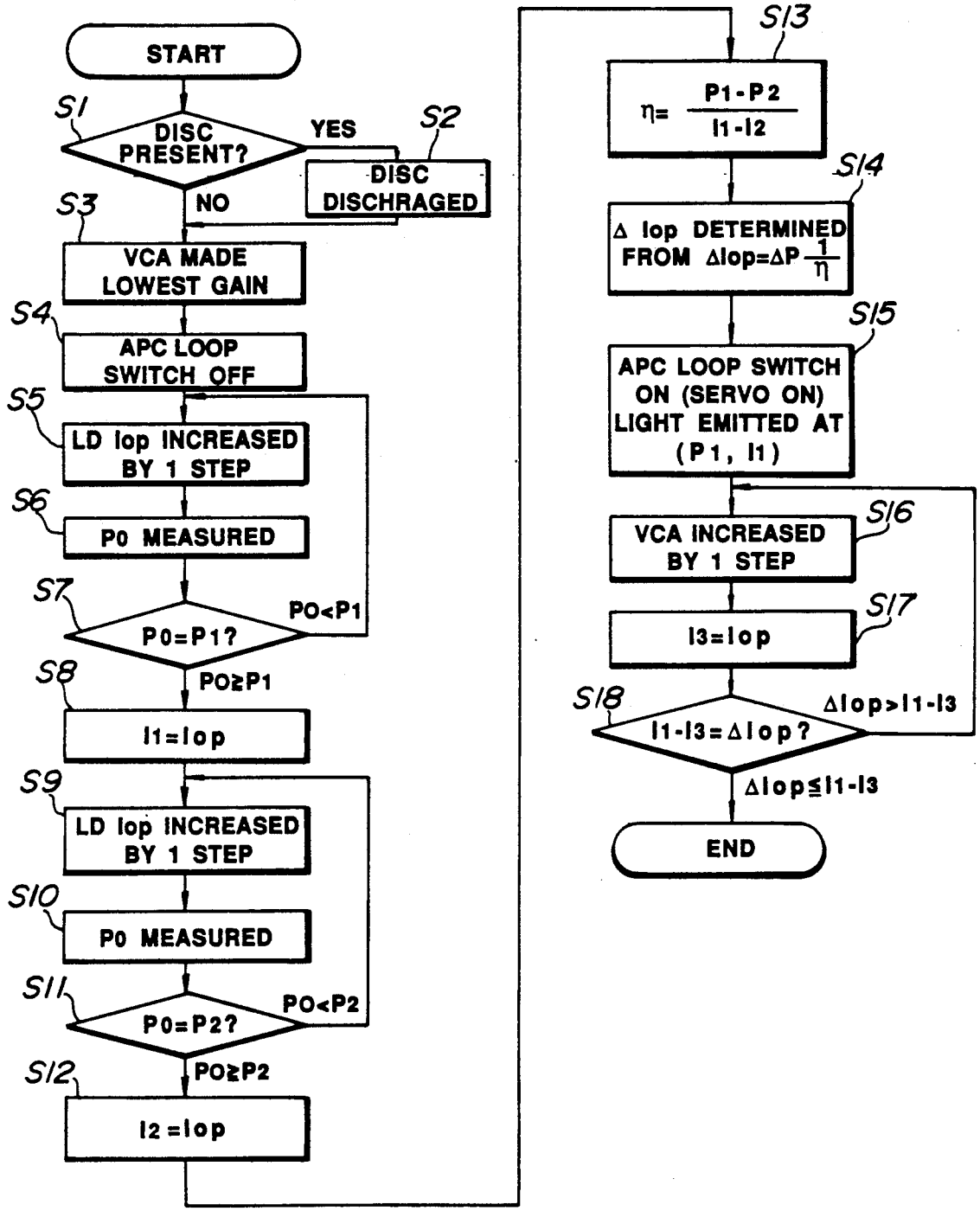
Figure 3:
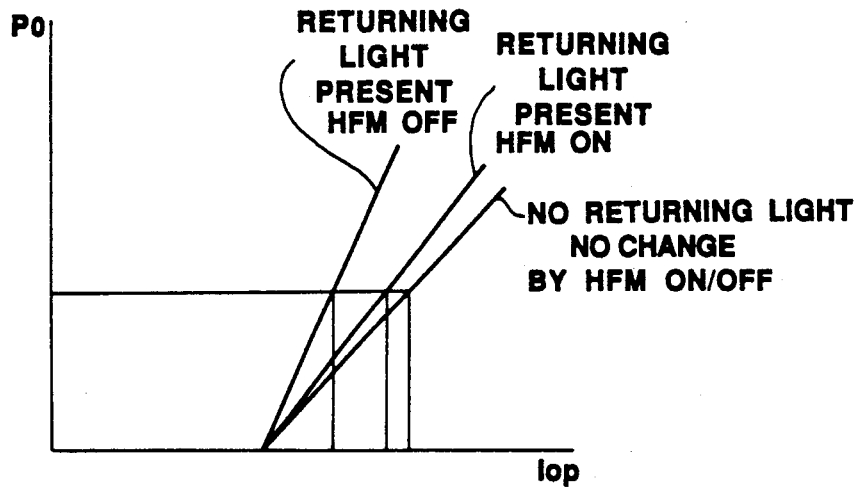
Figure 3:
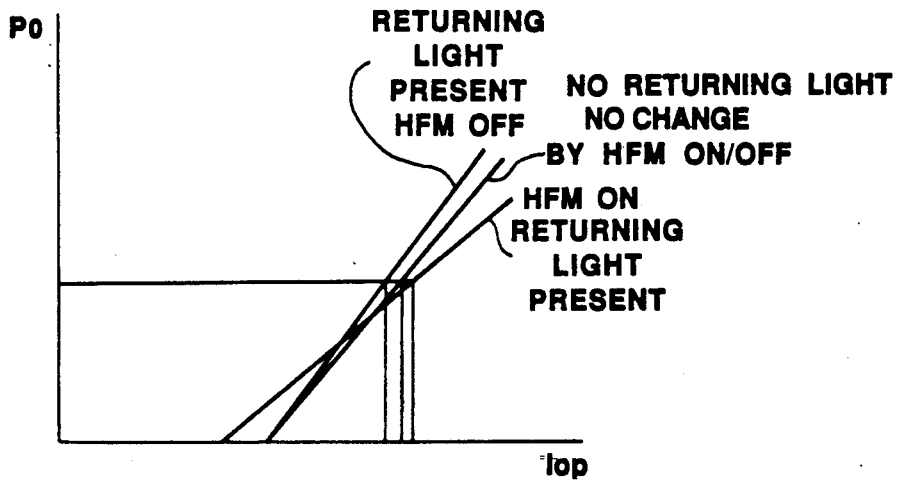

The high frequency superimposing amount adjusting operation in this embodiment shall be explained in the following by using FIG. 2.

The operation is started at such proper timing as, for example, the time when the electric power source is incorporated. When the operation starts, first, in the step S1 (mentioned merely as S1 by omitting the word "step" hereinafter), it is detected by a medium detecting part 10 whether a recording medium (disc) is present or not within the apparatus. If the recording medium is not present, the operation proceeds to S3. If the recording medium is present, in S2, the recording medium is discharged, that is, is moved out of the light path of the light from the LD1 and then the operation proceeds to S3. This is because, if the recording medium is present within the apparatus, there will be an influence of the returning light. Also, when the recording medium is discharged, there will be no danger of destroying the information.

The reason for measuring $\eta$ in the absence of the returning light shall be explained with reference to FIGS. 3(A) and (B). FIG. 3(A) shows the operating current-emitted light amount characteristics of the LD in the case that $\eta$ will rise if the returning light is present in case no high frequency is superimposed. FIG. 3(B) shows the operating current-emitted light amount characteristics of the LD in the case that $\eta$ will fall if the returning light is present in case no high frequency is superimposed. By the way, in FIGS. 3(A) and (B), the high frequency superimposing is mentioned as HMF. As described later, $\eta$ is measured where no high frequency is superimposed. However, as shown in FIGS. 3(A) and (B), the value of $\eta$ (the inclination of the straight line in FIGS. 3(A) and (B)) in the case that the returning light is present and no high frequency is superimposed (the returning light is present and the HFM is OFF) is so greatly different from the value of $\eta$ where a desired high frequency is actually superimposed (the returning light is present and the HFM is ON) as not to be able to be adopted. On the other hand, in the absence of the returning light, irrespective of whether the high frequency is superimposed or not, the operating current-emitted light amount characteristics are substantially the same as where the returning light is present and the HFM is ON and therefore the $\eta$ measured in the absence of the returning light can be adopted as an approximate value.

By the way, hereinafter, unless otherwise specified, all of such operations as the check and operation are to be made in an operating part 11.

Then, in S3, the gain of the VCA 7 of the high frequency oscillating unit 8 is made the lowest.

Then, in S4, the APC loop switch 9 is switched off.

Then, in S5, the LD driver 4 is controlled to increase the operating current I op of the LD 1 by one step. In S6, the emitted light amount of the LD 1 received by the PD 2 is amplified by the amplifier 5 and is input into the operating part 11 and the LD emitted light amount Po is measured. Then, in S7, $P_0$ is compared with a constant $P_1$ memorized in advance in the operating part 11, in case $P_0 \geq P_1$, in S8, $I_1 = I$ op. That is to say, in S5 to S8, when the LD emitted light amount $P_0 = P_1$, the LD operating current I op=$I_1$ is measured.

Then, the same as in said S5 to S8, in S9, the operating current I op of the LD 1 is increased by one step. In S10, the LD emitted light amount $P_0$ is measured. In S11, $P_0$ is compared with a constant $P_2$ memorized in advance in the operating part 11. In case $P_0 < P_2$, the operation returns to S9. In case $P_0 \geq P_2$, in S12, $I_2 = I$ op. That is to say, in S9 to S12, when the LD emitted light amount $P_0 = P_2$, the LD operating current I op=$I_2$ is measured.

By the way, $P_1$ and $P_2$ are set to be of such powers that $P_1 \neq P_2$ and I op may be measured with a sufficient resolution. In this example, $P_1$ is set to be a leading (reproducing) power and $P_2$ is set to be an erasing power.

Then, in S13, from the thus measured $I_1$ and $I_2$ is determined a ratio of the variation of the LD 1 operating current to the variation of the emitted light amount, that is, $$\eta = (P_1 - P_2)/(I_1 - I_2).$$

Then, in S14, the required amount of $\Delta$ I op is further determined from $\eta$. In such case, a predetermined $\Delta$ P is determined in advance and is memorized in the operating Part 11 and $\Delta$ I op is determined from the formula:

$$\Delta I\ op = P \cdot (1/\eta).$$

Said $\Delta$ P is determined by the noise reducing effect by superimposing a high frequency but the upper limit is made such value at which the light emitting peak power does not exceed the absolute maximum rating of the LD 1. For the life of the LD 1, the peak power had better be kept low.

Then, in S15, the APC loop switch 9 is switched on to operate the APC servo and make the LD 1 emit a light in the emitted light amount $P_1$ with the operating current $I_1$.

Then, in S16, the VCA 7 of the high frequency oscillating unit 8 is increased by one step. In S17, the operating current I op then is made $I_3$. Then, in S18, $\Delta$ I op is compared with $I_1 - I_3$. In case $\Delta$ I op > $I_1 - I_3$. the operation returns to S16. In case $\Delta$ I op $\leq I_1 - I_3$. the operation ends.

Figure 4:
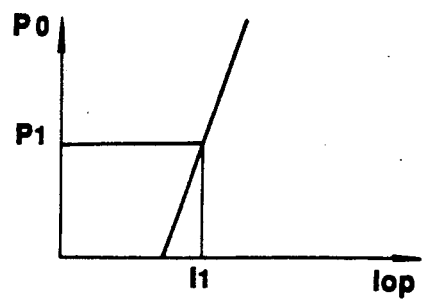
Figure 5:
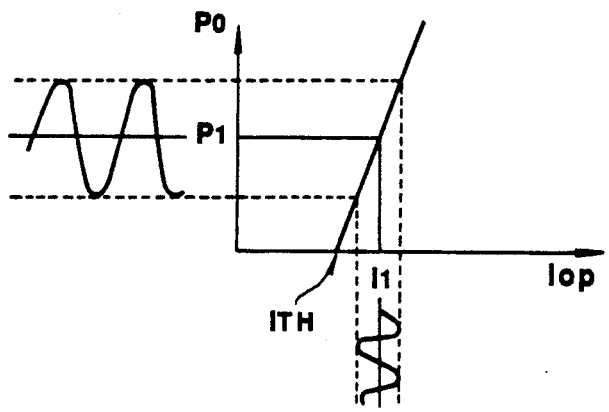
Figure 6:
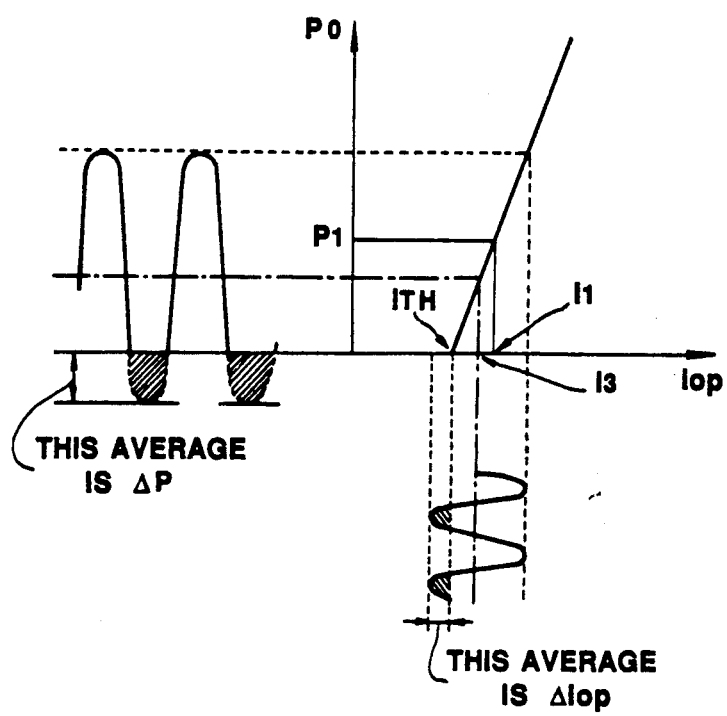

That is to say, in S16 to S18, the VCA 7 is raised by one step each, the I op is monitored while increasing the injected amount of the high frequency signal. Where the decrease $I_1 - I_3$ of the operating current of the LD 1 coincides with the prior determined $\Delta$ I op, the operation ends. As shown in FIG. 4, when the step of the VCA 7 is the smallest, the operating current I op will be $I_1$ and the emitted light amount Po will be $P_1$. As shown in FIG. 5, when the step of the VCA 7 is small, the operating current I op will have a high frequency superimposed on it. As a result, the emitted light amount Po will be modulated by the high frequency and will vary with $P_1$ in the center but will not be different from $P_1$ on the average. That is to say, $\Delta$ I op=0. As shown in FIG. 4, when the step of the VCA 7 becomes large and the high frequency modulation degree exceeds 100% (the minimum value of I op exceeds the oscillation threshold value $I_{TH}$), I op will reduce by the average value ($\Delta$ I op), because, as the APC is applied, Po will remain fixed to $P_1$, therefore the center of the amplitude of the emitted light amount will fall by the part (the hatched part in FIG. 6) corresponding to the emitted light amount until the LD 1 is off and the operating point will move so that $\Delta$ I op + I op = $I_1$. The larger the superimposed high frequency amount, the larger $\Delta$ I op. Where the gain of the VCA 7 is raised and $\Delta$ I op becomes the desired value ($\Delta P \cdot (1/\eta)$), the adjustment will be completed.

Thereafter, when the recording medium is put in and the information is to be reproduced, the APC loop switch 9 is switched on and the high frequency current of the amplitude set by the above described operation is superimposed.

Thus, according to this embodiment, the most adapted superimposed high frequency amount can be determined and a stable high frequency superimposing effect can be retained against the initial fluctuation of the LD 1, the temperature variation and the variation with the lapse of time.

Figure 7:
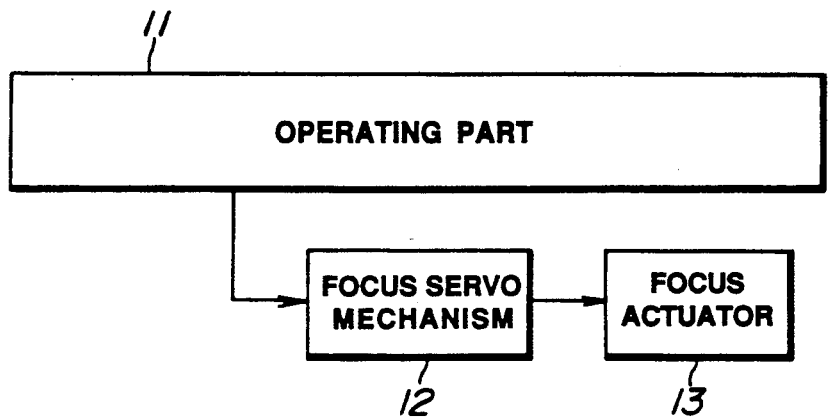
FIGS. 7 and 8 relate to the second embodiment of the present invention.
Figure 8:
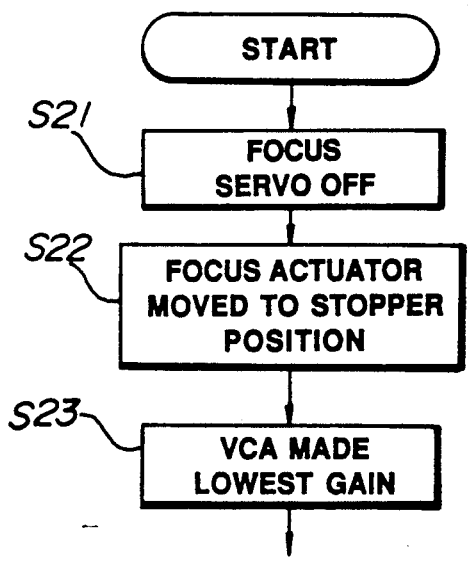

FIGS. 7 and 8 show the second embodiment of the present invention.

As shown in FIG. 7, in this embodiment, there is no medium detecting part and an operating part 11 is to control a focus servo mechanism 12. Said focus servo mechanism 12 drives and controls a focus actuator 13 which moves an objective lens of a light pickup in the optical axis direction.

As shown in FIG. 8, in the superimposed high frequency amount adjusting operation in this embodiment, when started, first, in S21, the focus servo mechanism 12 is controlled by the operating part 11 so as to switch off the focus servo. Then, in S22, the focus actuator 13 is moved to the stopper position through the focus servo mechanism 12 by the operating part 11. That is to say, the focal plane of the objective lens is removed from the recording medium surface. Thereafter, S3 and the steps following it of the first embodiment are carried out.

In the first embodiment, in case the recording medium is present within the apparatus, it is discharged but, in this embodiment, the focus servo mechanism 12 is controlled to move the focus actuator 13 up to the stopper position. Thereby, even in case the recording medium is present within the apparatus, the focal plane in which the light emitted from the LD 1 is condensed will deviate from the recording medium surface and therefore the returning light to the LD 1 will be reduced to be so low as to be no problem in practice.

The other formations, operations and effects are the same as in the first embodiment.

By the way, the present invention is not limited to said respective embodiments. For example, the LD emitted light amount (Po) may be detected from the AFC circuit 3. Also, the oscillator 6 and VCA 7 may be made integral with each other and the superimposed high frequency signal amount may be controlled by such system as controls the power source voltage, for example, of the oscillator 6.

Also, the flow chart shown in the embodiment is an example for explaining the operation and can be modified freely within a range having substantially no trouble. Such function as limits the upper limit and lower limit of the superimposed high frequency signal amount can be also added.

The present invention can be applied to any of the solely reproducing type, additionally noting type and rewriting type.

As explained above, according to the present invention, as the variation of the emitted light amount of the semiconductor laser with the variation of the operating current of the semiconductor laser is measured and, in response to the result, the superimposed high frequency amount is varied, there is an effect that the most adapted superimposed high frequency amount can be determined.

It is apparent that, in this invention, working modes different in a wide range can be formed on the basis of this invention without departing from the spirit and scope of the invention. This invention is not restricted by its specific working modes except being limited by the appended claims.

What is claimed is:

1. A semiconductor laser driving apparatus for driving a semiconductor laser and to be used for an optical information recording and reproducing apparatus doing at least one of recording and reproducing information in an information recording medium by using a light from said semiconductor laser, comprising:

an emitted light amount detecting means for detecting the emitted light amount of said semiconductor laser;

an output controlling means for controlling the output of said semiconductor laser on the basis of the detected output of said emitted light amount detecting means so as to be kept constant;

a driving means for feeding said semiconductor laser with an operating direct current;

a high frequency superimposing means for superimposing a high frequency current on said operating direct current from said driving means;

a measuring means for measuring the variation of the emitted light amount of said semiconductor laser with the variation of the operating current of said semiconductor laser in the absence of said information recording medium in the focus position of said semiconductor laser; and a superimposed amount controlling means for controlling the superimposed amount by said high frequency superimposing means in response to the measured result of said measuring means.

2. A semiconductor laser driving apparatus according to claim 1 further comprising a means for moving said information recording medium out of the light path of the light from said semiconductor laser before the measurement by said measuring means.

3. A semiconductor laser driving apparatus according to claim 1 further comprising a means for removing the focus position of said semiconductor laser from said information recording medium before the measurement by said measuring means.

4. A semiconductor laser driving apparatus according to claim 1 wherein said measuring means measures when the high frequency current is not superimposed on the operating direct current by said high frequency superimposing means.

5. A semiconductor laser driving apparatus according to claim 1 wherein said measuring means measures the emitted light amounts for a plurality of operating currents different from each other and measures the ratio of the variation of said emitted light amount to the variation of said operating current.

6. A semiconductor laser driving apparatus according to claim 5 wherein said output controlling means includes a means for adjusting the operating direct current from said driving means on the basis of the detected output of said emitted light amount detecting means and said superimposed amount controlling means includes a means for adjusting the superimposed amount so that the product of the decreased amount of said operating direct current accompanying superimposing the high frequency current by said high frequency superimposing means and said ratio measured by said measuring means may be of a predetermined value.

7. A method of controlling the superimposed amount of a high frequency current superimposed on the operating direct current of a semiconductor laser to be used for an optical information recording and reproducing apparatus doing at least one of recording and reproducing information in an information recording medium, comprising the steps of:

measuring the variation of the emitted light amount of said semiconductor laser with the variation of the operating current of said semiconductor laser; and adjusting said superimposed amount in response to the measured result by said measuring step.

8. A method according to claim 7 further comprising a step of moving said information recording medium out of the light path of the light from said semiconductor laser before the measurement by said measuring step.

9. A method according to claim 7 further comprising a step of removing the focus position of said semiconductor laser from said information recording medium before the measurement by said measuring step.

10. A method according to claim 7 wherein said measuring step is worked when said high frequency current is not superimposed on said operating direct current.

11. A method according to claim 7 wherein said measuring step includes a first measuring step of measuring the emitted light amounts of a plurality of operating currents different from each other and a second measuring step of measuring the ratio of the variation of said emitted light amount to the variation of said operating current by using the measured result of said first measuring step.

12. A method according to claim 11 wherein said adjusting step includes a step of adjusting the superimposed amount so that the product of the decreased amount of said operating direct current accompanying superimposing the high frequency current and said ratio may be of a predetermined value while adjusting said operating direct current so that the emitted light amount of said semiconductor laser may be constant.

* * * * *